US006536281B2

(12) United States Patent
Abe et al.

(10) Patent No.: US 6,536,281 B2
(45) Date of Patent: Mar. 25, 2003

(54) CAPACITIVE MICRO SENSOR, GYROSCOPE, AND INPUT DEVICE

(75) Inventors: Munemitsu Abe, Miyagi-ken (JP); Eiji Shinohara, Miyagi-ken (JP); Masayoshi Esashi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/757,450

(22) Filed: Jan. 9, 2001

(65) Prior Publication Data
US 2001/0008089 A1 Jul. 19, 2001

(30) Foreign Application Priority Data
Jan. 19, 2000 (JP) ........................................ 2000-010693

(51) Int. Cl.[7] ................................................ G01P 9/00
(52) U.S. Cl. ................................................... 73/504.16
(58) Field of Search ....................... 73/504.02, 504.03, 73/504.04, 504.12, 504.16; 310/370

(56) References Cited

U.S. PATENT DOCUMENTS 4,898,031 A    2/1990  Oikawa et al.
5,352,918 A   10/1994  Thomas et al.
5,417,312 A    5/1995  Tsuchitani et al.
5,892,153 A  * 4/1999  Weinberg et al. ........ 73/504.16

* cited by examiner

Primary Examiner—Richard A. Moller
(74) Attorney, Agent, or Firm—Brinks Hofer Gilson & Lione

(57) ABSTRACT

The invention provides a capacitive micro sensor that suppresses electric noise generated around the electrodes and enhances the S/N ratio to thereby enhance the detection sensitivity. The gyroscope of the invention includes a tuning fork having three legs, driving electrodes and detecting electrodes provided on two glass substrates, driving field-throughs that supply the driving electrodes with a drive signal, and detecting fields-through that extract a detecting signal from the detecting electrodes. And, a shield member between the detecting and the driving, shield members between the detecting and the detecting, and shield members between the driving and the driving are provided, which makes electrostatic shielding between the adjacent field-throughs of the areas where the driving field-throughs and the detecting field-throughs are arrayed.

49 Claims, 8 Drawing Sheets

CAPACITIVE MICRO SENSOR, GYROSCOPE, AND INPUT DEVICE

BACKGROUND OF THE INVENTION

1. Field of the Invention

The present invention relates to a capacitive micro sensor, a gyroscope, and an input device, specifically to a construction surrounding external pickup electrodes in the capacitive micro sensor.

2. Description of the Related Art

There has traditionally been a sensor that detects a dynamic magnitude of acceleration and pressure, etc., having a cantilever or a diaphragm in its structure. This type of sensor detects deformation of the cantilever or the diaphragm, produced when it receives an external force, as a variation of electrostatic capacity; and this detection method has generally been adopted. FIG. 10 illustrates a capacitive acceleration sensor, as an example of this type of sensor.

A sensor shown in FIG. 10 includes a silicon substrate 101, and two glass substrates 102, 103, in which the silicon substrate is sandwiched between the two glass substrates. The silicon substrate 101 has an elastic portion 104 (cantilever), a weight 105, and a conductive pole 106, etc., formed therein. The weight 105 is supported at the front end of the elastic portion 104 so that the weight is able to displace to a force of inertia by acceleration. The glass substrates 102, 103 have electrodes 107, 108 formed thereon, in which the electrodes face to each other with minute gaps between the weight 105 and themselves. Thus, a variation of capacitances between the weight 105 and the electrodes 107, 108 is detected as a detection signal. Both the glass substrates 102, 103 and the silicon substrate 101 are hermetically connected by the anode junction method, however in order to secure the electric conductivity to the weight 105 and the electrodes 107, 108 inside the sensor, the upper glass substrate 102 has holes 109 formed, and the holes 109 each have conductive layers 110, 111 formed on the surfaces thereof, which are made of aluminum to ensure connections to the external circuits. The conductive layer 110 is electrically connected to the weight 105 through an impurity layer 112, and the conductive layer 111 is electrically connected to the conductive pole 106 through an impurity layer 113. Further, the conductive pole 106 is electrically connected to the electrodes 107, 108.

This type of sensor is achieved as a micro sensor using the micro-machining technique. In such a case, often the silicon substrate is used for the structural body of a cantilever or a diaphragm, etc., and the glass substrates are used for the supporting bodies that sandwich the silicon substrate. The reason is that the silicon substrate is a material that allows the micro fabrication using the semiconductor manufacturing technique, and the glass substrate is a material that can easily be joined with the silicon substrate by means of the anode junction method. Further, both the sides of the silicon substrate are sealed by the glass substrates, which will form a package for the sensor. When this construction is adopted, in order to achieve conductivity with the structural body and the electrodes made of silicon which are sealed inside the package, as mentioned above, the pick-up portions of electric signals are required which are referred to as the so-called field-through, such as the conductive layers formed on the holes that are perforated on the glass substrates, and the conductive pole formed with the silicon substrate.

However, the conventional capacitive micro sensor generates electric noise during outputting an electric signal as the detection signal to thereby deteriorate the S/N ratio and lower the detection sensitivity, which is a problem.

This is a serious problem especially in a type of sensor that vibrates a cantilever or a diaphragm before the external force is exerted thereto. The reason is that this type of sensor has a driving electrode for driving the cantilever or the diaphragm in addition to a detecting electrode. However, in the micro sensor, the driving electrode and the detecting electrode are formed adjacently with minute gaps in most cases, whereby the driving electrode and the detecting electrode are in a capacitive coupling. Accordingly, as the driving electrode has a drive signal supplied, being subject to the influence of the signal, the detecting electrode has undesired voltages induced and generates electric noise. Further, as in the foregoing example, when the detection signal is picked up by way of the feed-through, electric noise is generated in terms of the parasitic capacitance between the driving feed-through and the detecting feed-through.

As an example of a sensor provided with both the driving electrode and the detecting electrode, a gyroscope is known which uses a tuning fork made of a conductive silicon, and the like. This gyroscope detects a vibration perpendicular to the direction of the vibration, which is generated by the Coriolis' force when the legs of the tuning fork are vibrated (driven) in one direction and an angular velocity is inputted during the vibration with the longitudinal direction of the legs as the central axis. Because the magnitude of a vibration generated by the Coriolis' force corresponds to the magnitude of an angular velocity, the gyroscope can be applied to an angular velocity sensor, for example, to a coordinate input device for a personal computer, and so forth.

Although a great variety of contrivances have been made in regard to this gyroscope, still higher detection sensitivity thereof is desired. To realize further enhancement of the detection sensitivity, the problem of the foregoing electric noise must be solved in the gyroscope as well. Also, in view of the current situations of further miniaturization in various sensors, the generation of electric noise by the capacitive coupling between driving electrodes, or between detecting electrodes is considered as ignorable.

SUMMARY OF THE INVENTION

The present invention has been made in view of the foregoing problem, and provides a capacitive micro sensor, a gyroscope, and an input device using the gyroscope, capable of suppressing to the utmost the electric noise generated around the electrodes inside the sensor and enhancing the detection sensitivity by an enhanced S/N ratio.

In accordance with an aspect of the invention, the capacitive micro sensor includes a structural body, at least one driving electrode that drives the structural body, at least one driving line portion that supplies the driving electrode with a drive signal, at least one detecting electrode that detects a displacement of the structural body driven by the driving electrode on the basis of a variation of capacitance, and at least one detecting line portion that transmits a detection signal from the detecting electrode, wherein a shield member is provided between the driving electrode and the detecting electrode, or between the driving line portion and the detecting line portion, that makes electrostatic shielding between the electrodes or between the line portions.

In accordance with an aspect of the invention, the gyroscope includes a vibratory strip, a driving electrode disposed to face to the vibratory strip, that drives the vibratory strip, a driving line portion that supplies the driving electrode with a drive signal, a detecting electrode disposed facing to the vibratory strip, that detects a displacement perpendicular to the drive direction of the vibratory strip, and a detecting line portion that transmits a detection signal from the detecting electrode, where a first shield member is provided between the driving electrode and the detecting electrode, or between the driving line portion and the detecting line portion, that makes electrostatic shielding between the electrodes or between the line portions.

In this invention, the "line portion" when referred to as the "driving line portion" or the "detecting line portion" signifies the whole portion serving as the transmission paths electrically connected to the driving electrode, detecting electrode, and the like, that exchanges signals between each of these electrodes and the line portion. Therefore, the "field-through formed with silicon", for example, is included in the "line portion" of this invention.

A gyroscope having the field-through will now be described as an example, with respect to the function and effect of the invention.

FIG. 6A is a typical chart illustrating the construction of a conventional gyroscope. A driving electrode 61 and a detecting electrode 62 are disposed with minute gaps between a vibratory strip 60 (corresponding to the legs of a tuning fork) and each of the electrodes. A driving field-through 63 for supplying the driving electrode 61 with a drive signal and a detecting field-through 64 for outputting a detection signal from the detecting electrode 62 are connected to the electrode 61 and the electrode 62, respectively. The driving field-through 63 and the detecting field-through 64 form the capacitive coupling, and the capacitance thereof is given by C1. And, the vibratory strip 60 and the detecting electrode 62 form the capacitive coupling, and the capacitance thereof is given by C2.

In this gyroscope, when a drive voltage (Vdrive=Vd) is applied to the driving field-through 63, a detection voltage (Vdetect) from the detecting field-through 64 should be zero in a state that the vibratory strip 60 is not displaced. However, the following voltage is induced in practice.

$$Vdetect = \{C1/(C1+C2)\} \cdot Vd \quad (1)$$

This will be a noise accompanied with the genuine detection signal.

The insertion of a shield member between the driving field-through and the detecting field-through is only needed to achieving suppression of the noise generation. FIG. 6B is a typical chart illustrating the construction of a gyroscope of the invention. In this construction, a shield member 65 is inserted between the driving field-through 63 and the detecting field-through 64, and the shield member 65 is grounded, whereby the driving field-through 63 and the detecting field-through 64 are electrically isolated. As the result, when Vdrive=Vd is applied to the driving field-through 63, Vdetect=0 is achieved on the detecting field-through 64, thereby achieving suppression of the noise generation.

Thus, in the capacitive micro sensor according to the invention, the insertion of the shield member between the driving electrode and the detecting electrode, or between the driving line portion and the detecting line portion forms electrostatic shielding in the areas between these electrodes or in the areas between these line portions, which prevents generation of electric noise and enhances the S/N ratio, thereby achieving enhancement of the detection sensitivity. Similarly, in the gyroscope according to the invention, the insertion of the first shield member between the driving electrode and the detecting electrode, or between the driving line portion and the detecting line portion forms electrostatic shielding in the areas between these electrodes or in the areas between these line portions, which prevents generation of electric noise and enhances the S/N ratio, thereby achieving enhancement of the detection sensitivity of the angular velocity.

The gyroscope according to the invention can take on a concrete configuration that the vibratory strip, the driving line portion, the detecting line portion, and the first shield member are all formed on one plane. Further, all these members can be formed of an identical conductive material.

More concretely, by means of the semiconductor manufacturing technique, a conductivity is given to a silicon semiconductor substrate or the like that facilitates the micro fabrication, and this material is processed by the photolithography and etching technique. Thus, the vibratory strip, driving line portion, detecting line portion, and first shield member are made up on one sheet of a semiconductor substrate. This method will achieve the construction of the invention without making the manufacturing process complicated.

When the driving electrode and the detecting electrode are disposed on a substrate to face to the vibratory strip, the first shield member may be provided on the substrate between the driving electrode and the detecting electrode, or between the driving line portion and the detecting line portion.

That is, in the above example, the first shield member is formed with the same silicon as the vibratory strip, and when the driving electrode and the detecting electrode are formed on the substrate, concretely the driving electrode, the detecting electrode, and line portions (wirings) connecting to these electrodes are formed on the substrate with a metal membrane. In that case, the use of the metal membrane for the first shield member and the provision of the same on the substrate between the driving electrode and the detecting electrode and/or between the driving line portion and the detecting line portion, will shield areas between these electrodes and/or areas between the line portions, thus displaying the same function and effect as above.

In accordance with another aspect of the invention, the gyroscope includes a vibratory strip, a driving electrode disposed to face to the vibratory strip that drives the vibratory strip, a driving line portion that supplies the driving electrode with a drive signal, a detecting electrode disposed to face to the vibratory strip, that detects a displacement perpendicular to the drive direction of the vibratory strip, and a detecting line portion that transmits a detection signal from the detecting electrode, wherein at least one of the driving electrode and the detecting electrode is formed with plural electrodes that are isolated from each other, and a second shield member is provided between the adjacent electrodes of these plural electrodes, or between the line portions each connected to the adjacent electrodes, that makes electrostatic shielding between the electrodes or between the line portions.

As mentioned above, for the suppression of electric noise, it is most effective to shield the areas between the driving electrode and the detecting electrode, or the areas between the driving line portion and the detecting line portion. However, depending on the construction of the gyroscope or the drive and detection system thereof, there is a possibility that the shielding between the driving electrodes (or driving line portions) or between the detecting electrodes (or detecting line portions) further suppresses generation of noise. For example, in a type of gyroscope in which the detecting electrode is not made up with one electrode, but with mutually isolated plural electrodes, yet these plural electrodes are allocated into the electrodes whose capacitance variation becomes positive and the other electrodes whose capacitance variation becomes negative when the vibratory strip is displaced to one direction, and a differential detection between these electrodes are carried out, if the electrodes whose capacitance variation becomes positive and the electrodes whose capacitance variation becomes negative are adjacent, it is conceivable that the detection voltage on the one electrodes varies, being subject to the influence of the detection voltage on the other electrodes. In such a case, the provision of the second shield member that makes electrostatic shielding between the adjacent detecting electrodes or between the adjacent detecting line portions will eliminate the influence from the adjacent electrodes or line portions, thus achieving enhancement of the detection accuracy.

In regard to the second shield member that shields the areas between the driving portions or between the detecting portions, the vibratory strip, line portions each connected to the plural electrodes, and the second shield member can be formed on one plane. Further, all these members can be formed of an identical conductive material.

This construction will also achieve the same function and effect as the case with the first shield member.

Further, when the driving electrode and the detecting electrode are provided on the substrate that is disposed to face to the vibratory strip, the second shield member may be provided between the adjacent electrodes of the plural electrodes on the substrate, or between the line portions each connected to the adjacent electrodes. In this aspect as well, it is the same as the first shield member.

An input device according to the invention includes the gyroscope as described above.

The input device according to the invention, using the gyroscope with a high detection sensitivity, achieves an excellent response.

DETAILED DESCRIPTION OF THE PREFERRED EMBODIMENTS

[First Embodiment]

The first embodiment according to the invention will now be described with reference to FIG. 1 through FIG. 4.

Figure 1:
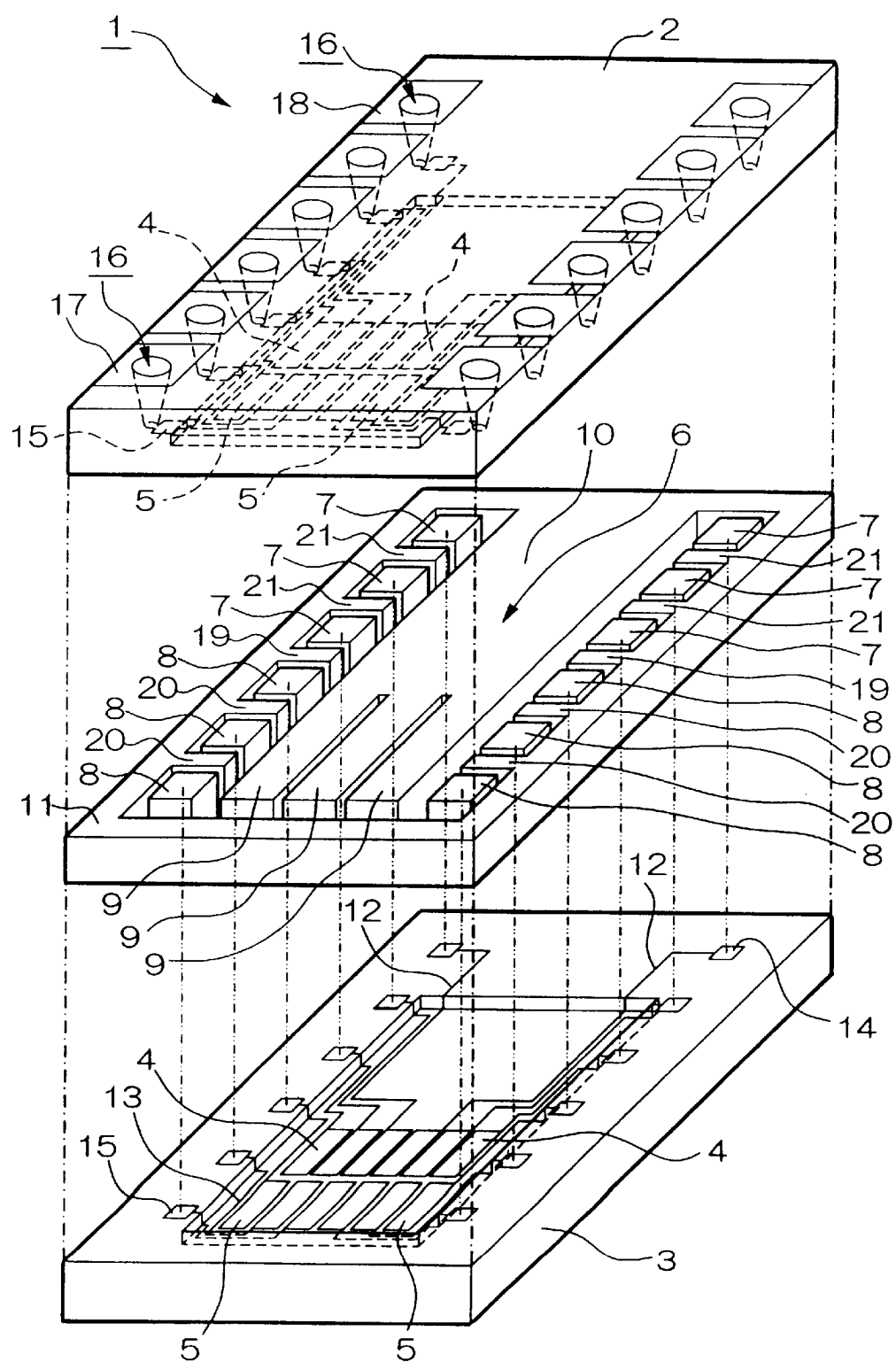
FIG. 1 is an exploded perspective view illustrating a gyroscope of the first embodiment according to the invention.
Figure 2:
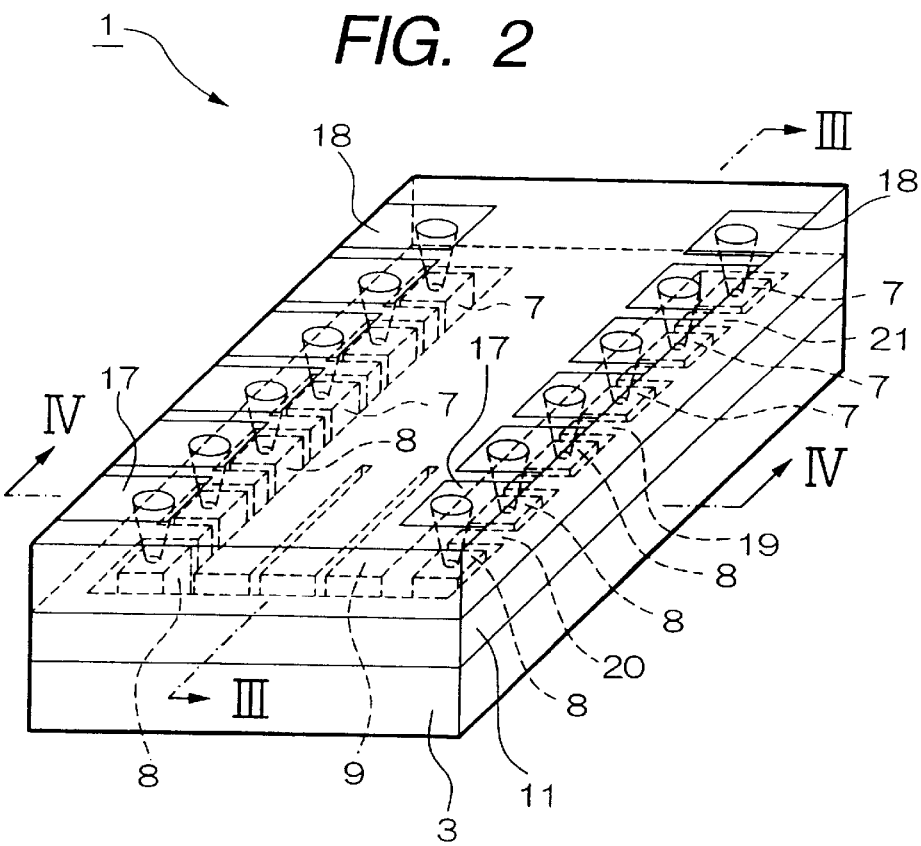
FIG. 2 is a perspective view of the gyroscope in the assembly in FIG. 1.
Figure 3:
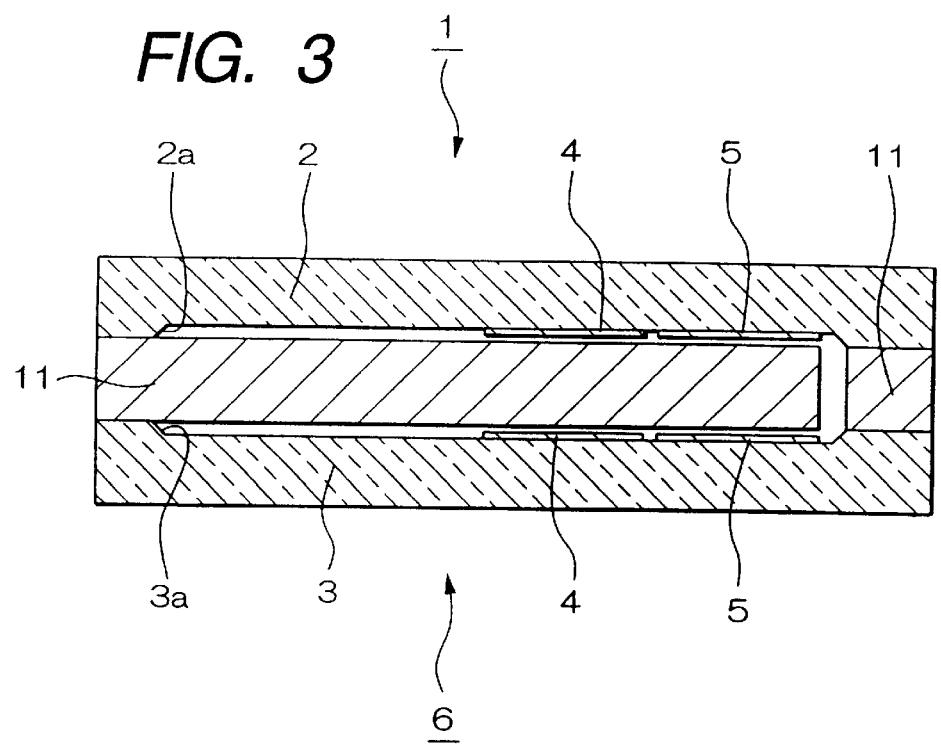
FIG. 3 is a side section along the line III—III in FIG. 2.
Figure 4:
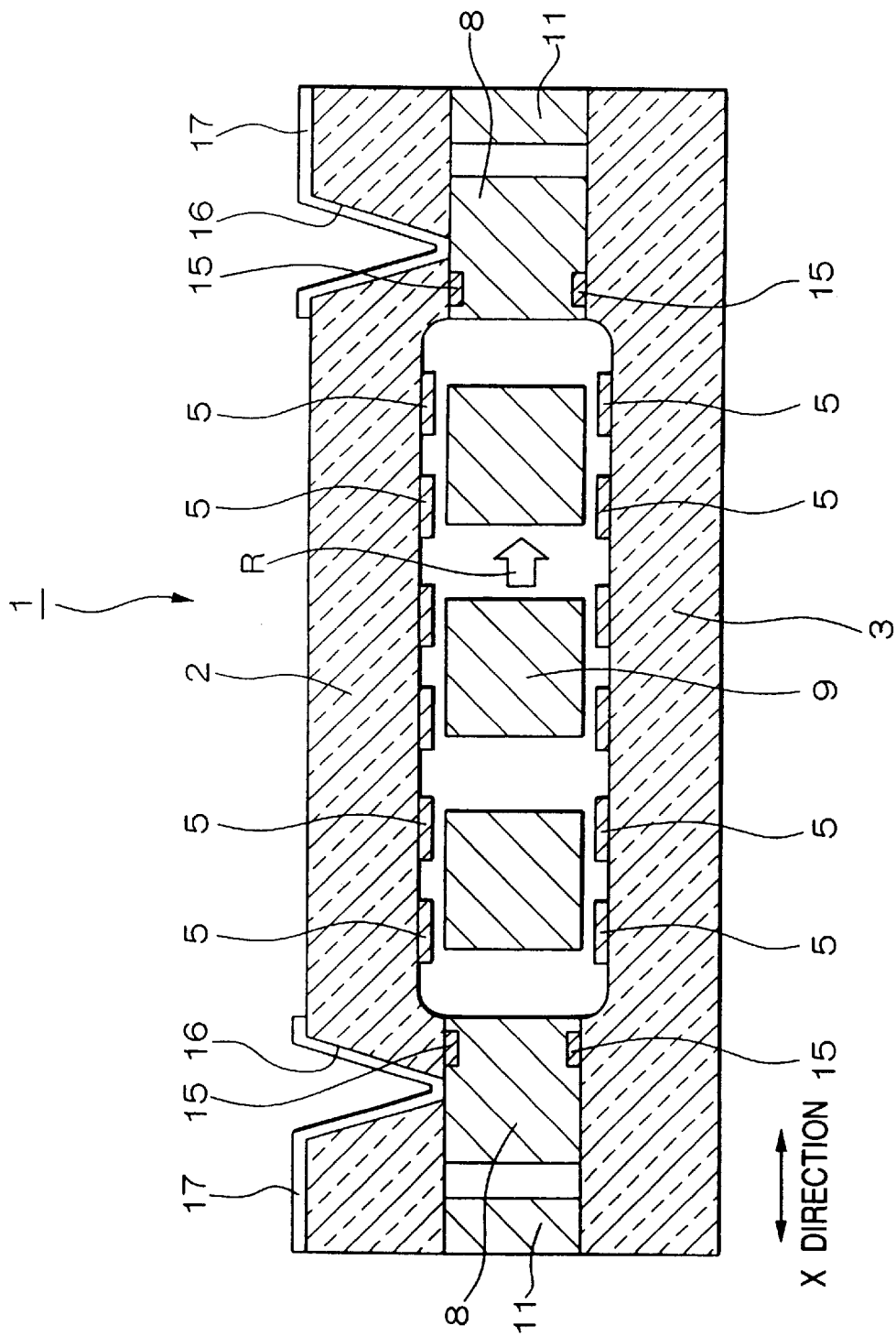
FIG. 4 is a front section along the line IV—IV in FIG. 2.

FIG. 1 is an exploded perspective view illustrating the total construction of a gyroscope relating to first embodiment, FIG. 2 is a perspective view in which the members of the gyroscope in FIG. 1 are assembled, FIG. 3 is a side section along the line III—III in FIG. 2, and FIG. 4 is a front section along the line IV—IV in FIG. 2.

In the drawings, the symbol 2 denotes an upper glass substrate (base material), 3 a lower glass substrate (base material), 4 a driving electrode, 5 a detecting electrode, 6 a tuning fork, 7 a driving field-through (driving line portion) and 8 a detecting field-through (detecting line portion).

Here, in the drawings, some components are appropriately omitted in order to make the drawings easy to view.

A gyroscope 1 of the first embodiment uses a three-leg type tuning fork 6 having three legs 9 (vibratory strips) and a supporting portion 10 that couples the base ends of these legs, as shown in FIG. 1 and FIG. 2. A frame portion 11 is provided to surround the tuning fork 6, and the tuning fork 6 and the frame portion 11 are formed with a sheet of silicon substrate having the conductivity and thickness of about 200 $\mu$m. As shown in FIG. 3, the frame portion 11 is sandwiched between the upper glass substrate 2 and the lower glass substrate 3 and fastened thereby. Recesses 2a, 3a are formed with the depths of about 10 $\mu$m in the areas surrounded by the insides of the glass substrates 2, 3 and the upper and lower sides of the tuning fork 6. Thereby, gaps of approximately 10 $\mu$m are formed between the glass substrates 2, 3 and the tuning fork 6, and the legs 9 of the tuning fork 6 are floating in the spaces, which allows the vibrations thereof.

Both the glass substrates 2, 3 and the frame portion 11 are joined by the anode junction between glass and silicon. Therefore, The tuning fork 6 is placed in an airtight space surrounded by both the glass substrates 2, 3 and the frame portion 11. Both the glass substrates 2, 3 also functions as the package for the gyroscope 1.

As shown in FIG. 1 and FIG. 2, in a position facing to the base ends of the legs 9 in the recess 2a under the upper glass substrate 2, two driving electrodes for each of the legs 9, namely, totally six driving electrodes 4 are formed to extend in the longitudinal direction of the legs 9. The driving electrodes 4 are formed of an aluminum film or a chromium film having the thickness of about 300 nm, or a film formed by laminating a platinum film of about 70 nm thick on a titanium film of about 30 nm thick (hereunder, called platinum/titanium film). And, driving wirings 12 for supplying the driving electrodes 4 with a drive signal are integrally formed with the aluminum film or the chromium film, or the platinum/titanium film, etc., which have the same layer as the electrodes. And, in a position facing to the front ends of the legs 9, located further outward than the driving electrodes 4, two detecting electrodes for each of the legs 9, namely, six detecting electrodes 5 in total are formed to extend in the longitudinal direction of the legs 9. The detecting electrodes 5 are also formed with the same materials as the driving electrodes 4, and detecting wirings 13 each are formed in continuity with the detecting electrodes 5. Further, in an area located outside of the recess 2a under the upper glass substrate 2, on the front ends of the driving wirings 12 and the detecting wirings 13 are provided intermediate pads 14, 15 made of the same metal membrane as the wirings.

Further, the constructions of the driving electrodes 4, detecting electrodes 5, driving wirings 12 connected to the driving electrodes 4, and detecting wirings 13 connected to the detecting electrodes 5 are completely the same with regard to the upper glass substrate 2 and the lower glass substrate 3.

As shown in FIG. 1 and FIG. 2, the tuning fork 6 and the frame portion 11 are integrally formed. On both the sides of the tuning fork 6, six pieces for each side, 12 pieces of driving feed-throughs 7 in total and detecting fields-through 8 made of silicon are provided along the longitudinal direction of the tuning fork 6, which are arrayed as islands isolated from the tuning fork 6 and the frame portion 11. Three pieces of six feed-throughs for one row, located on the front ends of the legs 9, correspond to the detecting feed-throughs 8; and three pieces located on the base ends of the legs 9 correspond to the driving feed-throughs 7.

And, when the gyroscope 1 in FIG. 1 or FIG. 2 is viewed from the front, the three detecting feed-throughs 8 on the left row are allocated for taking out signals from the three detecting electrodes 5 on the left; and the detecting feed-throughs 8 from the near side toward the far side correspond to the detecting electrodes 5 from the center toward the left end. On the other hand, the three driving feed-throughs 7 on the left row are allocated for supplying signals to the three driving electrodes 4 on the left; and the driving feed-throughs 7 from the near side toward the far side correspond to the driving electrodes 4 from the left end toward the center. In the same manner, the detecting feed-throughs 8 and the driving feed-throughs 7 on the right row are each allocated for the detecting electrodes 5 and the driving electrodes 4. These feed-throughs 7, 8 are isolated from the tuning fork 6 and the frame portion 11, but they are formed on the same silicon substrate, and they have the same conductivity as the tuning fork 6 and the frame portion 11.

The connection between the detecting wirings 13 on both the glass substrates 2, 3 and the detecting feed-throughs 8, and the connection between the driving wirings 12 on both the glass substrates 2, 3 and the driving feed-throughs 7 will be explained with reference to FIG. 4. Here, the detecting side will be explained as the example, but the driving side has completely the same construction.

As shown in FIG. 4, the intermediate pads 15 connecting to the detecting wirings 13 are each formed on the upper side of the lower glass substrate 3 and on the lower side of the upper glass substrate 2, and the detecting feed-throughs 8 are joined on the areas where the intermediate pads 15 are formed. And, tapered through-holes 16 are formed on the areas corresponding to the detecting fields-through 8, on the upper glass substrate 2. Conductive films formed along the inner faces of the through-holes 16 are extended to the upper faces of the upper glass substrate 2, which serve as external connection pads 17. The conductive films are formed with two layers of, for example, a chromium film of about 50 nm thick on the lower layer and a gold film of about 1000 nm thick on the upper layer thereof. Therefore, two intermediate pads 15 extending from the detecting electrodes 5 and the detecting fields-through 8 located on the same areas in the plan view of the gyroscope 1 are electrically connected, and the detecting fields-through 8 and the external connection pads 17 are brought into contact inside the through-holes 16 to be electrically connected. Further, the external connection pads 17 are connected to the external circuits (not illustrated) by means of the wire-bonding, or the like, whereby the detection signals are taken out to the external circuits by way of the detecting electrodes 5, detecting fields-through 8, and external connection pads 17. The symbols 18 in FIG. 1 and FIG. 2 denote the external connection pads electrically connected to the driving electrodes 4.

As shown in FIG. 4, two detecting electrodes 5 on each of the glass substrates 2, 3 for each of the legs 9, four detecting electrodes 5 in total for each of the legs 9 are disposed to face each other. However, each of the legs 9 and the corresponding two detecting electrodes 5 on one of the glass substrates are disposed in a state that the outermost ends of the two detecting electrodes 5 do not coincide with the edges of each of the legs 9 in the displacement detection direction (x direction in the drawing), and they are disposed with a displacement of more than the maximum magnitude in the displacement detection direction of the legs 9. The breadth of the detecting electrodes 5 is set to a dimension larger than the maximum magnitude in the displacement of the legs 9. In this configuration, when the legs 9 move right (in the arrow R direction), the facing areas to the detecting electrodes 5 located on the right sides of the legs 9 increase, so that the capacitance variation becomes positive; and the facing areas to the detecting electrodes 5 located on the left sides of the legs 9 decrease, so that the capacitance variation becomes negative. Therefore, these capacitance variations can be detected separately to carry out the differential detection. Since the initial values of the two capacitances are equal in this case, the difference will eliminate the initial capacitances, and the capacitance variation will be acquired. Thus, the noise components contained in the initial capacitances can be cancelled, whereby the detection accuracy can be enhanced.

As shown in FIG. 1 and FIG. 2, wall portions are formed in the areas between the adjoining two of the driving feed-throughs 7 and the detecting fields-through 8. These wall portions are integrally formed with the frame portion 11. Five wall portions are provided between the six fields-through on one side. The central wall portion of the five wall portions functions as the electrostatic shielding between the adjoining detecting field-through 8 and the driving field-through 7, and constitutes a shield portion 19 between the detecting and the driving (first shield member). The two wall portions on the near side function as the electrostatic shielding between the adjoining detecting feed-throughs 8, and constitute shield portions 20 between the detecting and the detecting (second shield member). The two wall portions on the far side function as the electrostatic shielding between the adjoining driving feed-throughs 7, and constitute shield portions 21 between the driving and the driving (second shield member).

Since it is not necessarily essential in the function of the gyroscope 1, and is necessary for the conveniences on production described later, the drawing is omitted; however in practice, an identical potential pattern is provided on the lower side of the upper glass substrate 2 and on the upper side of the lower glass substrate 3 in the areas except for the regions where the detecting electrodes 5 and detecting wirings 13 and the driving electrodes 4 and driving wirings 12 are formed, and the equi potential pattern is made of the same aluminum film or chromium film or platinum/titanium film as that of these electrodes and wirings.

In manufacturing the gyroscope 1 with the foregoing construction, first a glass substrate is prepared, the hydrofluoric acid etching of the glass substrate is conducted with the mask, and the recesses 2a, 3a are formed in the areas corresponding to the tuning fork 6 on the glass substrate. The metal membranes are formed on the faces where the recesses 2a, 3a are formed, and thereafter, by using the photolithography and etching technique, the detecting electrodes 5, the detecting wirings 13, the driving electrodes 4, the driving wirings 12, and the equi potential pattern are formed. Through these processes, the lower glass substrate 3 is completed. As for the upper glass substrate 2, further the through-holes 16 and the metal membranes are formed, and the external connection pads 17, 18 are formed by the patterning.

Next, a silicon substrate is prepared, and the lower side of the silicon substrate and the lower glass substrate 3 are connected by means of the anodic bonding method. Here, the area where the frame portion 11 will be made later is connected. The anodic bonding method applies a positive potential to the silicon substrate and a negative potential to the glass substrate so as to easily connect the silicon and the glass. However, in the area where the silicon substrate makes the tuning fork 6, since the gap between the lower glass substrate 3 and the silicon substrate is only about 10 µm, the electrostatic attraction during the anodic bonding warps the silicon substrate to bring it into contact with the lower glass substrate 3. Accordingly, the warped part is also connected, and thereby a vibratory tuning fork cannot be formed. Thus, in order to prevent the area that should not be connected to the lower glass substrate 3 from being connected, the equi potential pattern that makes the potential of the area on the lower glass substrate 3 into the equi potential as the silicon substrate is formed on the surface of the lower glass substrate 3. This is the same in regard to the upper glass substrate 2.

Next, a resist pattern is formed which has a shape of areas to leave silicon on the surface of the silicon substrate, such as the tuning fork 6, frame portion 11, detecting feed-throughs 8, and driving feed-throughs 7, and the etching to pierce the silicon substrate is conducted by means of the anisotropic etching such as the reactive etching, etc. Thereby, the tuning fork 6, frame portion 11, detecting feed-throughs 8, and driving feed-throughs 7, etc., are formed, and the tuning fork 6 is floating in a space above the lower glass substrate 3. Thereafter, the resist pattern is peeled off.

Next, the upper side of the silicon substrate connected to the lower glass substrate 3 and the upper glass substrate 2 are connected by means of the anodic bonding method. Also, in this case, the frame portion 11 is connected to the upper glass substrate 2. Through these processes, the gyroscope 1 of the embodiment is accomplished.

In the use of the gyroscope 1 of the embodiment, the frame portion 11 is grounded, and an oscillator as a drive source is connected to the external wirings that are connected to the external connection pads 18 on the side of the driving electrodes 4. Here, since the frame portion 11, tuning fork 6, shield portion 19 between the detecting and the driving, shield portions 20 between the detecting and the detecting, and shield portions 21 between the driving and the driving are all integrally formed, the potentials of these portions become equal. Therefore, the grounding of the frame portion 11 brings all of the tuning fork 6, shield portion 19, shield portions 20, and shield portions 21 into a grounded state. Further, in FIG. 4, a first capacitance detector is connected between the tuning fork 6 and the external wirings connected to the external connection pads 17 for the detecting electrodes 5 that are stuck out on the right of the legs 9, and a second capacitance detector is connected between the tuning fork 6 and the external wirings connected to the external connection pads 17 for the detecting electrodes 5 that are stuck out on the left of the legs 9.

And, when a drive signal of some kHz in frequency is applied between the tuning fork 6 and the driving electrodes 4, the legs 9 of the tuning fork 6 vibrate vertically. In that state, when an angular velocity with the longitudinal direction of the legs 9 as the rotational axis is inputted, a horizontal vibration is generated in accordance with the magnitude of the inputted angular velocity. Here, the legs 9 of the tuning fork 6 and the detecting electrodes 5 are in a facing state, and accompanied with the horizontal vibration of the legs 9, the facing areas of the legs 9 and the detecting electrodes 5 vary to produce the capacitance variations. The differential detection of the capacitance variations at that moment by the first and second capacitance detectors will detect the magnitude of the angular velocity.

In the gyroscope 1 of the embodiment, the shield portion 19 is provided between the adjoining driving field-through 7 and the detecting field-through 8, and thereby the electrostatic shielding is made between the driving feed-throughs 7 and the detecting feed-throughs 8. Electric noise induced on the detecting feed-throughs 8 by the applied drive signal is suppressed to enhance the S/N ratio, thereby achieving enhancement of the detection sensitivity of the angular velocity.

Further, in the gyroscope 1 of the embodiment, the differential detection is implemented, and a different detection signal is picked up from the adjoining feed-throughs 8. Therefore, being subject to an influence by the signals from the adjoining feed-throughs, the detection signal may vary. In this respect, since the shield portions 20 between the detecting and the detecting are provided between the adjoining detecting feed-throughs 8, the influence from the adjoining feed-throughs 8 can be eliminated, thus achieving enhancement of the detection accuracy.

Further, since the tuning fork 6, frame portion 11, driving feed-throughs 7, detecting feed-throughs 8, shield portion 19 between the detecting and the driving, shield portions 20 between the detecting and the detecting, and shield portions 21 between the driving and the driving are all integrally formed with one sheet of silicon substrate, the manufacturing process will not become complicated, and the construction of this embodiment can be accomplished by means of the general silicon processing technique.

Further, in the gyroscope 1 of the embodiment, since the tuning fork 6 is sandwiched between the glass substrate 2, 3, the area of the tuning fork 6 is protected by the glass substrate 2, 3 and it becomes easy to handle. Further, since it assumes a structure that dust is difficult to come in the area of the tuning fork 6, disturbances are suppressed, thereby enhancing the detection accuracy. The structure also allows the vacuum lock, which achieves enhancement of the Q factor (performance index expressing the magnitude of resonance), and improves conversion efficiency from the electric energy supplied to the device into the mechanical vibration energy, thus lowering the drive voltage.

[Second Embodiment]

The second embodiment of the invention will be described with reference to FIG. 5.

Figure 5:
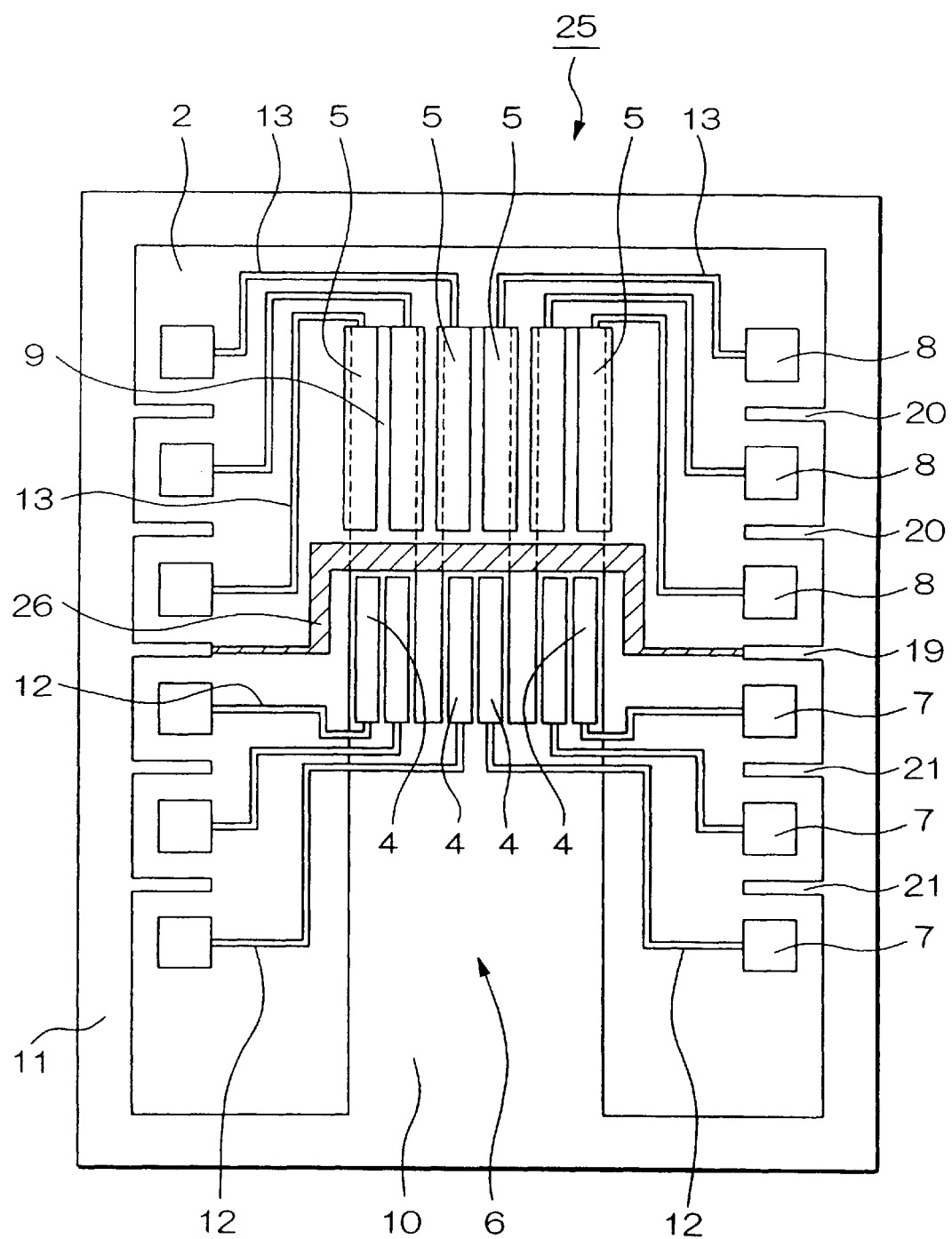
FIG. 5 is a plan view illustrating a gyroscope of the second embodiment according to the invention.
Figure 6A:
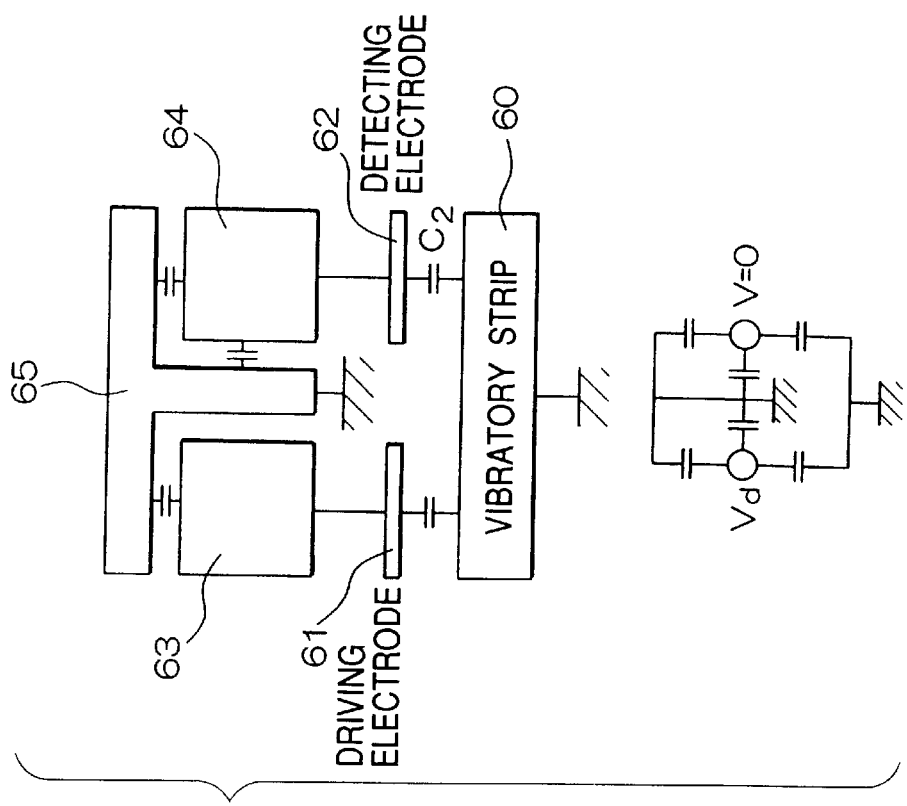
FIG. 6A is a typical chart illustrating a configuration of an electrode pickup portion of a conventional gyroscope.
Figure 6B:
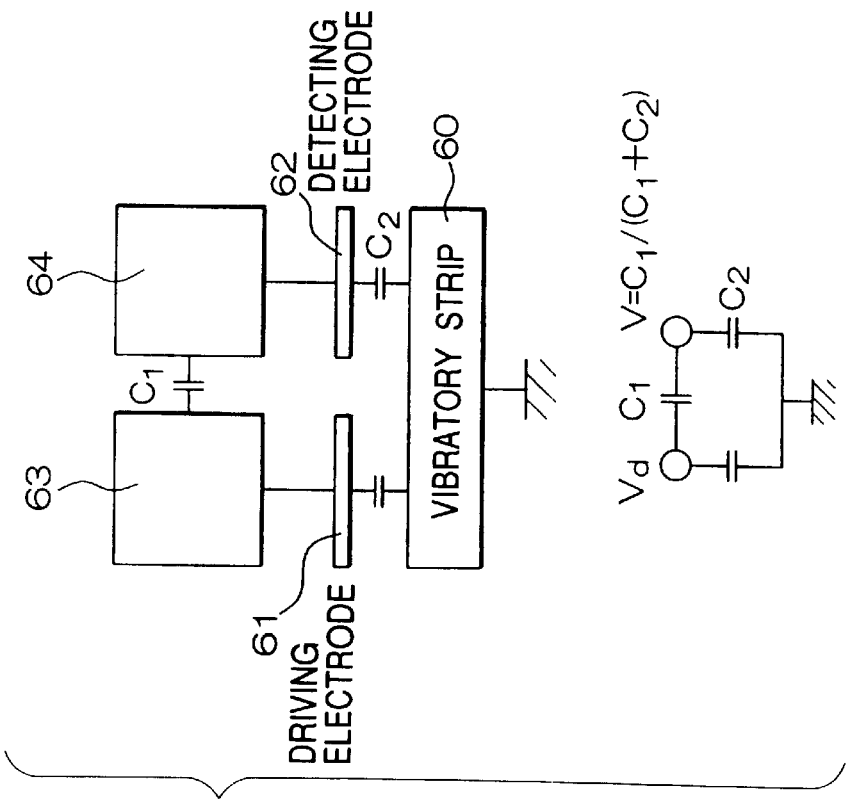
FIG. 6B is a typical chart illustrating a configuration of an electrode pickup portion of the gyroscope according to the invention.

FIG. 5 is a plan view illustrating the total configuration of a gyroscope of the second embodiment.

The fundamental configuration of the gyroscope of the second embodiment is the same as that of the first embodiment, however the difference lies in that the gyroscope of the second embodiment is provided with a shield member on the glass substrate in addition.

In FIG. 5, the components common to FIG. 1 through FIG. 4 are given the same symbols, and the detailed explanations thereof will be omitted. Also, to make the drawing easy to view, the components are appropriately omitted.

As shown in FIG. 5, in a gyroscope 25 of this embodiment, between the detecting electrodes 5 and the driving electrodes 4 which underlie the upper glass substrate 2, between the detecting wirings 13 and the driving wirings 12, a shield wiring 26 between the detecting and the driving (first shield member) is provided in order to make electrostatic shielding between the above electrodes 5 and 4, and between the above wirings 13 and 12. The shield wiring 26 between the detecting and the driving extends across the upper glass substrate 2. Both ends of the shield wiring 26 are brought into contact with the shield member 19 between the detecting and the driving which lies between the detecting feed-throughs 8 and the driving feed-throughs 7, thus achieving electric connection. The shield wiring 26 between the detecting and the driving is formed of an aluminum film or a chromium film, or a platinum/titanium film, in the same manner as the detecting electrodes 5, driving electrodes 4, detecting wirings 13, and driving wirings 12.

According to the construction of this embodiment, when the frame portion 11 is grounded on actual use, simultaneously the shield wiring 26 between the detecting and the driving is also grounded through the shield member 19 between the detecting and the driving. Therefore, not only the electrostatic shielding between the detecting feed-throughs 8 and the driving feed-throughs 7, as in the first embodiment, but also the electrostatic shielding between the detecting electrodes 5 and the driving electrodes 4 formed of metal membranes and between the detecting wirings 13 and the driving wirings 12 are achieved. Thereby, electric noise is further suppressed as a whole, and the detection sensitivity is enhanced even more.

[Third Embodiment]

Figure 8:
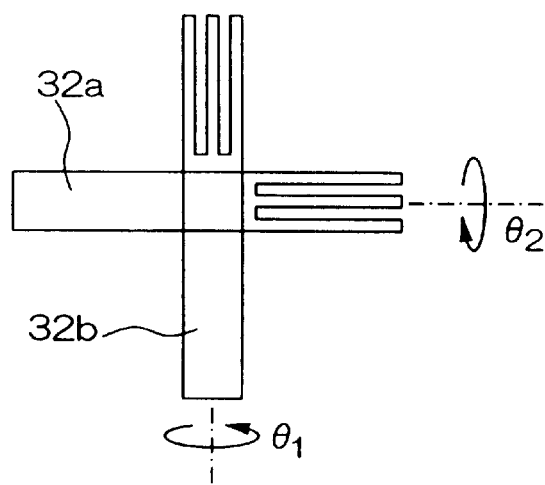
FIG. 8 is a plan view illustrating a configuration of two gyroscopes used for the pen-type mouse.
Figure 9:
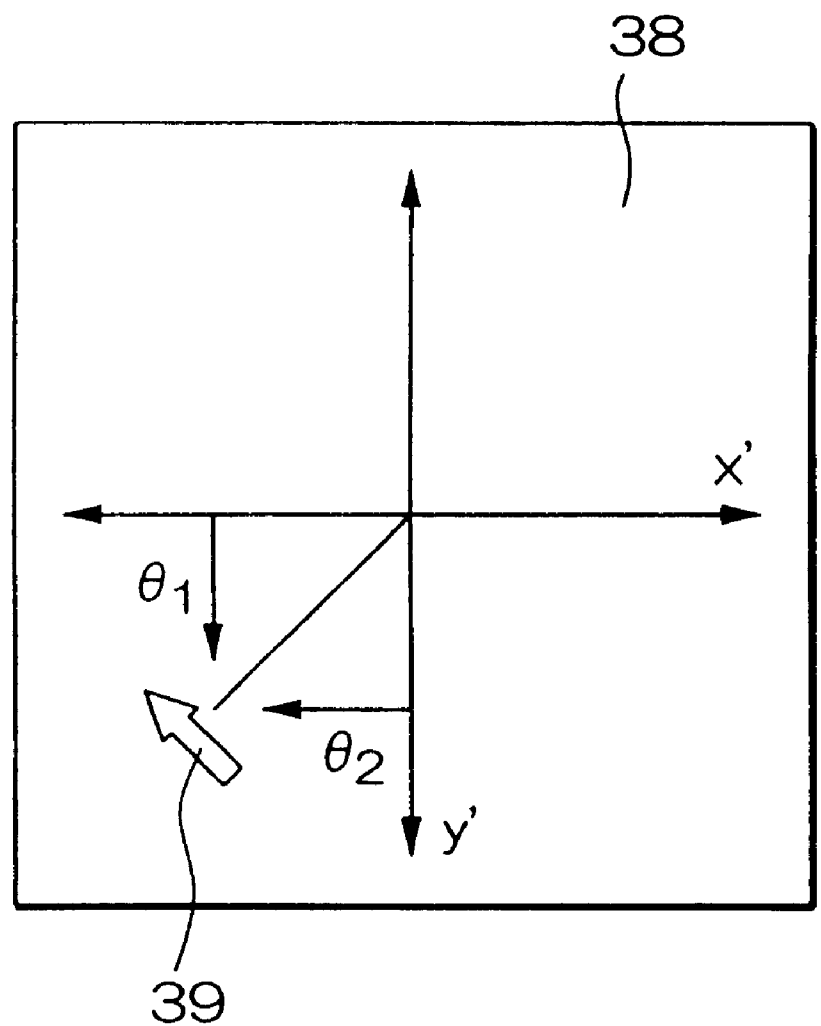
FIG. 9 is a front view illustrating a display screen of a personal computer where operations are processed with the pen-type mouse.
Figure 10:
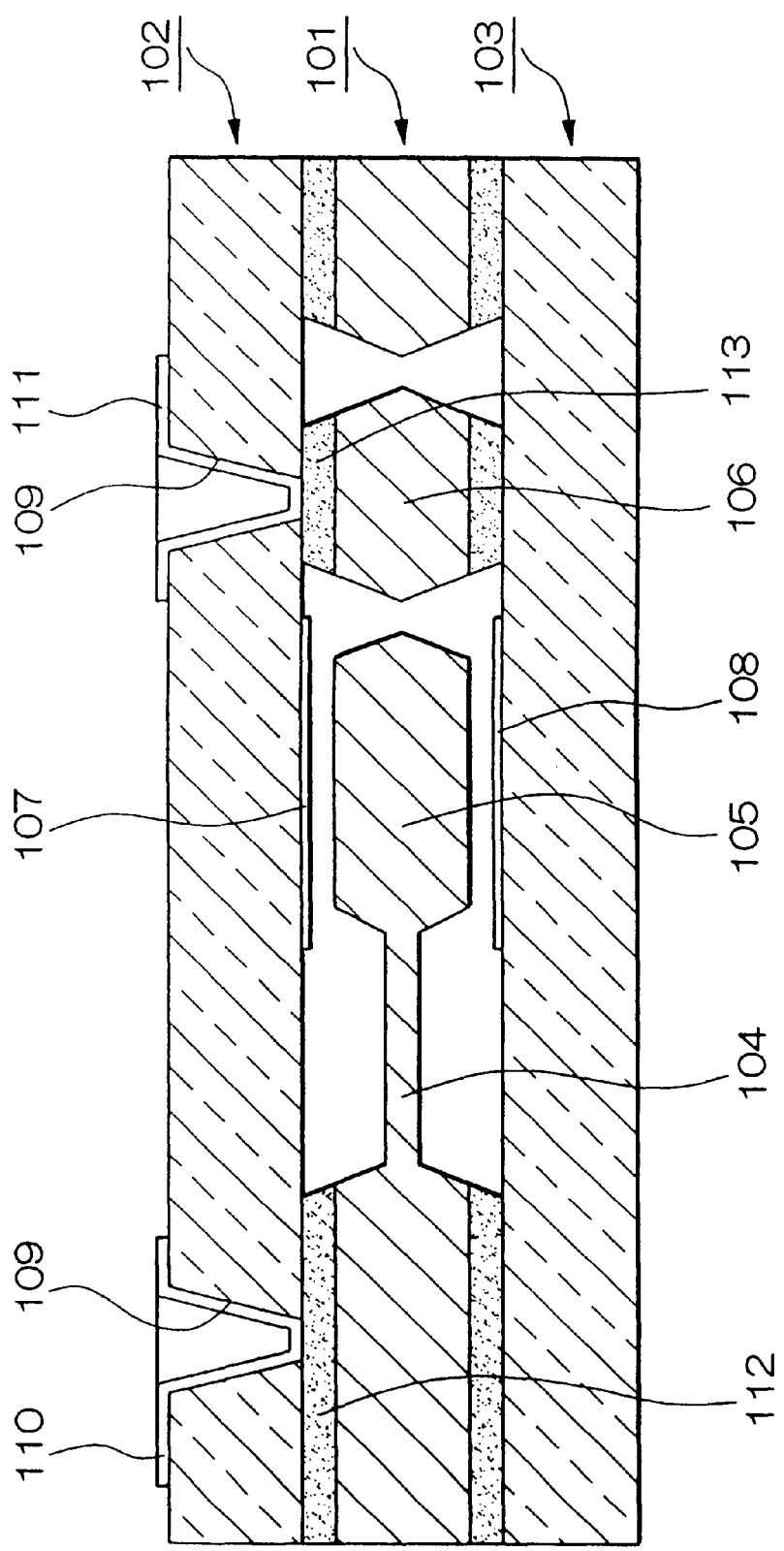
FIG. 10 is a sectional view illustrating an example of a conventional capacitive acceleration sensor.

The third embodiment of the invention will be described with reference to FIG. 7 through FIG. 9.

This embodiment relates to an input device using the gyroscope of the first or the second embodiment, concretely to an example in which the gyroscope is applied to a pen-type mouse being the coordinate input device for a personal computer.

Figure 7:
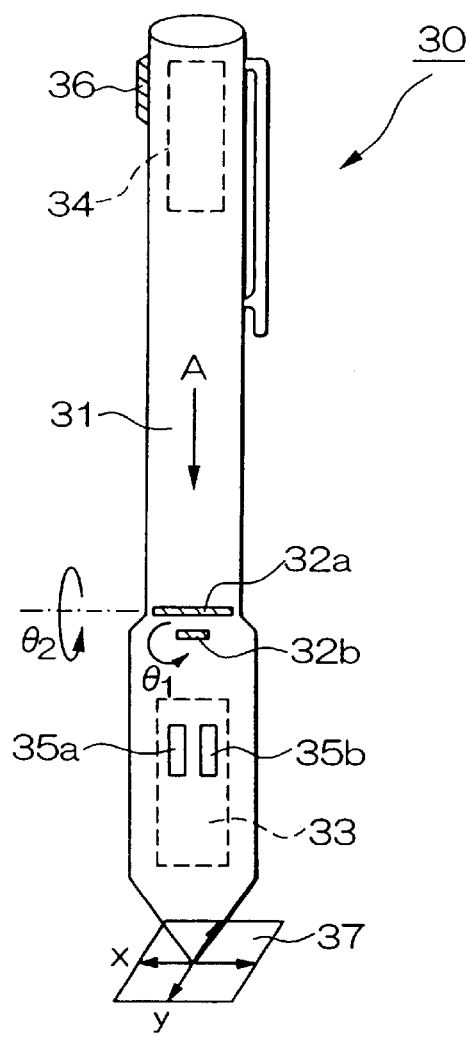
FIG. 7 is a perspective view illustrating a pen-type mouse of the third embodiment according to the invention.

A pen-type mouse 30 of this embodiment contains, as shown in FIG. 7, two gyroscopes 32a, 32b inside a pen-type case 31, as described in the first or the second embodiment. As shown in FIG. 8, the two gyroscopes 32a, 32b are disposed such that the legs of the tuning forks thereof extend perpendicularly when the pen-type mouse 30 is viewed from above (viewed from the direction of the arrow A in FIG. 7). Further, it contains a driving/detecting circuit 33 for driving the gyroscopes 32a, 32b and detecting an angle of rotation. In addition, it contains a battery 34 inside the case 31, two switches 35a, 35b corresponding to the general switch for a mouse, and a switch 36 for the mouse body, etc.

A user holds the pen-type mouse 30 and moves the pen in a desired direction, whereby the user is able to move the cursor on the display screen so as to follow the movement of the pen. That is, as the user moves the pen along the X-axis direction on a paper 37 in FIG. 7, the gyroscope 32b detects a rotation angle θ1, and as the user moves the pen along the Y-axis direction on the paper 37, the gyroscope 32a detects a rotation angle θ2. When the user moves the pen in other directions than the above, the combination of the rotation angle θ1 and the rotation angle θ2 is detected. Therefore, the personal computer receives the signal corresponding to the rotation angle θ1 and the rotation angle θ2 from the pen-type mouse 30, and as shown in FIG. 9, it moves a cursor 39 by a distance corresponding to the magnitude of the rotation angles θ1, θ2 from the point of the cursor 39 before movement on a display screen 38 so as to bring the rotation angles θ1 and θ2 in correspondence with the X'-axis and Y'-axis on the display screen 38. Thus, the pen-type mouse 30 achieves the same operation as the general mouse using the optical encoder or the like.

The gyroscopes 32a, 32b used herein have the features of small size, low drive voltage, and high sensitivity; therefore, they can suitably be used for a small-sized coordinate input device such as the pen-type mouse 30. Also, they can be applied to the general input device that detects an angular velocity, as in a navigation system and a head mounted display.

The scope of the invention is not limited to the embodiments described above, and various modifications and changes will be possible within the spirit and scope of the invention. For example, the number of the electrodes in the gyroscopes of the aforementioned embodiments may arbitrarily be set. However, from the point of sensitivity enhancement, a larger number of them is desired as long as the processing is possible. Also, the shape and the number of the shield members between the electrodes or between the feed-throughs may be arbitrary. In the aforementioned embodiments, in order not to make the manufacturing process complicated, the shield members between the feed-throughs are formed of the same silicon as the feed-throughs, and the shield members between the electrodes are formed of the same metal membranes as the material of the electrodes. However, if the manufacturing process allows complexity, the shield members may employ different materials. Further, in the above embodiments, the three-leg type tuning fork is used, however the number of the legs may be otherwise, and it may be one.

Further, the gyroscope may be constructed with a tuning fork made of silicon and one glass substrate, instead of using the two glass substrates sandwiching the tuning fork. This will provide the gyroscope with a still more simplified structure. In consideration of the lamination by the anodic bonding method, silicon is compatible with glass, however with regard to the glass substrate, one in which a glass is fused on the surface of an arbitrary base material may be a substitution. Also, as a material of the tuning fork, carbon may be used instead of silicon. In addition, the materials and shapes, etc., of the components in the aforementioned embodiments are not limited to the concrete descriptions thereof, and they may be varied appropriately.

Furthermore, the foregoing embodiments have discussed the gyroscope; however the invention can be applied to an arbitrary capacitive micro sensor other than the gyroscope, such as an acceleration sensor and pressure sensor. Especially, in a type of sensor that beforehand vibrates a structure such as a cantilever or a diaphragm, the provision of the shield members unique to this invention, between the driving electrodes and the detecting electrodes, or between the driving line portions and the detecting line portions each connected to these electrodes, will suppress generation of electric noise due to the electrostatic induction, and enhance the S/N ratio, thus leading to enhancement of the detection sensitivity.

As having been discussed above, according to the capacitive micro sensor and gyroscope of the invention, the provision of the shield members that achieves electrostatic shielding between the driving electrodes and the detecting electrodes, or between the driving line portions and the detecting line portions prevents generation of electric noise due to the electrostatic induction, whereby the S/N ratio as well as the detection sensitivity can be enhanced. And, the use of the gyroscope of the invention accomplishes a small-sized input device with an excellent response, such as a coordinate input device for a personal computer.

What is claimed is:

1. A capacitive micro sensor comprising a vibratory strip, at least one driving electrode that drives the vibratory strip, at least one driving line portion that supplies the driving electrode with a drive signal, at least one detecting electrode that detects a displacement of the vibratory strip driven by the driving electrode on the basis of a variation of capacitance, and at least one detecting line portion that transmits a detection signal from the detecting electrode, wherein a shield member is provided in a direct line between the driving electrode and the detecting electrode, that provides electrostatic shielding between both electrodes.

2. A gyroscope comprising a vibratory strip, a driving electrode disposed to face to the vibratory strip, that drives the vibratory strip, a driving line portion that supplies the driving electrode with a drive signal, a detecting electrode disposed to face to the vibratory strip, that detects a displacement perpendicular to the drive direction of the vibratory strip, and a detecting line portion that transmits a detection signal from the detecting electrode, wherein a shield member is provided in a direct line between the driving electrode and the detecting electrode, that provides electrostatic shielding between both electrodes.

3. A gyroscope according to claim 2, wherein the vibratory strip, the driving line portion, the detecting line portion, and the shield member are all formed on one plane.

4. A gyroscope according to claim 2, wherein the vibratory strip, the driving line portion, the detecting line portion, and the shield member are all formed of an identical conductive material.

5. A gyroscope according to claim 2, wherein the driving electrode and the detecting electrode are provided on base materials that are disposed to face to the vibratory strip, and the shield member is provided between the driving electrode and the detecting electrode on the base materials.

6. A gyroscope comprising a vibratory strip, a driving electrode section disposed to face to the vibratory strip, that drives the vibratory strip, a driving line portion that supplies the driving electrode section with a drive signal, a detecting electrode section disposed to face to the vibratory strip that detects a displacement perpendicular to the drive direction of the vibratory strip, and a detecting line portion that transmits a detection signal from the detecting electrode section, wherein at least either the driving electrode section or the detecting electrode section is formed with a plurality of electrodes that are isolated from each other, and a shield member is provided in a direct line between both electrode sections, that provides electrostatic shielding between both electrode sections.

7. A gyroscope according to claim 6, wherein the vibratory strip, the line portions each connected to the electrode sections, and the shield member are all formed of on one plane.

8. A gyroscope according to claim 6, wherein the vibratory strip, the line portions each connected to the electrode sections, and the shield member are all formed of an identical conductive material.

9. A gyroscope according to claim 6, wherein the driving electrode section and the detecting electrode section are provided on base materials that are disposed to face to the vibratory strip, and the shield member is provided between both electrode sections on the base materials.

10. A gyroscope according to claim 4, wherein the conductive material is silicon.

11. An input device using a gyroscope, the gyroscope comprises;
a vibratory strip, a driving electrode disposed to face to the vibratory strip, that drives the vibratory strip, a driving line portion that supplies the driving electrode with a drive signal, a detecting electrode disposed to face to the vibratory strip, that detects a displacement perpendicular to the drive direction of the vibratory strip, and a detecting line portion that transmits a detection signal from the detecting electrode, wherein a shield member is provided in a direct line the driving electrode and the detecting electrode, that provides electrostatic shielding between both electrodes.

12. A gyroscope according to claim 8, wherein the conductive material is silicon.

13. An input device according to claim 11, wherein, in the gyroscope, the vibratory strip, the driving line portion, the detecting line portion, and the shield member are all formed on one plane.

14. An input device according to claim 11, wherein, in the gyroscope, the vibratory strip, the driving line portion, the detecting line portion, and the shield member are all formed of an identical conductive material.

15. An input device according to claim 11, wherein, in the gyroscope, the driving electrode and the detecting electrode are provided on base materials that are disposed to face to the vibratory strip, and the shield member is provided between the driving electrode and the detecting electrode on the base materials.

16. An input device using a gyroscope, the gyroscope comprises;
a vibratory strip, a driving electrode section disposed to face to the vibratory strip, that drives the vibratory strip, a driving line portion that supplies the driving electrode section with a drive signal, a detecting electrode section disposed to face to the vibratory strip that detects a displacement perpendicular to the drive direction of the vibratory strip, and a detecting line portion that transmits a detection signal from the detecting electrode section, wherein at least either the driving electrode section or the detecting electrode section is formed with a plurality of electrodes that are isolated from each other, and a shield member is provided in a direct line between both electrode sections, that provides electrostatic shielding between both electrode sections.

17. An input device according to claim 16, wherein, in the gyroscope, the vibratory strip, the line portions each connected to the electrode sections, and the shield member are all formed on one plane.

18. An input device according to claim 16, wherein, in the gyroscope, the vibratory strip, the line portions each connected to the electrode sections, and the shield member are all formed of an identical conductive material.

19. An input device according to claim 16, wherein, in the gyroscope, the driving electrode section and the detecting electrode section are provided on base materials that are disposed to face to the vibratory strip, and the shield member is provided between both electrode sections on the base materials.

20. An input device according to claim 14, wherein the conductive material is silicon.

21. An input device according to claim 18, wherein, in the gyroscope, the conductive material is silicon.

22. A capacitive micro sensor comprising a vibratory strip, at least one driving electrode that drives the vibratory strip, at least one driving line portion that supplies the driving electrode with a drive signal, at least one detecting electrode that detects a displacement of the vibratory strip driven by the driving electrode on the basis of a variation of capacitance, and at least one detecting line portion that transmits a detection signal from the detecting electrode, wherein a shield member is provided in a direct line between the driving line portion and the detecting line portion, that provides electrostatic shielding between both line portions.

23. A gyroscope comprising a vibratory strip, a driving electrode disposed to face to the vibratory strip, that drives the vibratory strip, a driving line portion that supplies the driving electrode with a drive signal, a detecting electrode disposed to face to the vibratory strip, that detects a displacement perpendicular to the drive direction of the vibratory strip, and a detecting line portion that transmits a detection signal from the detecting electrode, wherein a shield member for electrostatically shielding between the line portions is provided in a direct line between the driving line portion and the detecting line portion.

24. A gyroscope according to claim 23, wherein the vibratory strip, the driving line portion, the detecting line portion, and the shield member are all formed on one plane.

25. A gyroscope according to claim 23, wherein the vibratory strip, the driving line portion, the detecting line portion, and the shield member are all formed of an identical conductive material.

26. A gyroscope according to claim 23, wherein the driving electrode and the detecting electrode are provided on base materials that are disposed to face to the vibratory strip.

27. An input device using a gyroscope, the gyroscope comprises;
a vibratory strip, a driving electrode disposed to face to the vibratory strip, that drives the vibratory strip, a driving line portion that supplies the driving electrode with a drive signal, a detecting electrode disposed to face to the vibratory strip, that detects a displacement perpendicular to the drive direction of the vibratory strip, and a detecting line portion that transmits a detection signal from the detecting electrode, wherein a shield member for electrostatically shielding between the line portions is provided in a direct line between the driving line portion and the detecting line portion.

28. A gyroscope comprising a vibratory strip, a driving electrode section disposed to face to the vibratory strip, that drives the vibratory strip, a driving line portion that supplies the driving electrode with a drive signal, a detecting electrode section disposed to face to the vibratory strip that detects a displacement perpendicular to the drive direction of the vibratory strip, and a detecting line portion that transmits a detection signal from the detecting electrode section, wherein at least either the driving electrode section or the detecting electrode section is comprised of a plurality of electrodes separated from each other, and wherein a shield member for electrostatically shield between the line portions is provided in a direct line between the line portions connected to each of the electrode sections.

29. A gyroscope according to claim 28, wherein the vibratory strip, the line portions each connected to both electrode sections, and the shield member are all formed of on one plane.

30. A gyroscope according to claim 28, wherein the vibratory strip, the line portions each connected to the electrode sections, and the shield member are all formed of an identical conductive material.

31. A gyroscope according to claim 28, wherein the driving electrode section and the detecting electrode section are provided on base materials that are disposed to face to the vibratory strip, and the shield member is provided between the line portions each connected to both electrode sections on the base materials.

32. An input device using a gyroscope, the gyroscope comprises;
a vibratory strip, a driving electrode section disposed to face to the vibratory strip, that drives the vibratory strip, a driving line portion that supplies the driving electrode section with a drive signal, a detecting electrode section disposed to face to the vibratory strip that detects a displacement perpendicular to the drive direction of the vibratory strip, and a detecting line portion that transmits a detection signal from the detecting electrode section, wherein at least either the driving electrode section and the detecting electrode section is comprised of a plurality of electrodes separated from each other, and a shield member for electrostatically shielding between the line portions is provided in a direct line between the line portions connected to each of the electrode sections.

33. A capacitive micro sensor according to claim 1, wherein the shield member is provided in a recess where both electrodes oppositely face to each other.

34. A gyroscope according to claim 2, wherein the shield member is provided in a recess where both electrodes oppositely face to each other.

35. A gyroscope according to claim 6, wherein the shield member is provided in a recess where both electrode sections oppositely face to each other.

36. An input device according to claim 11, wherein the shield member is provided in a recess where both electrodes oppositely face to each other.

37. An input device according to claim 16, wherein the shield member is provided in a recess where both electrode sections oppositely face to each other.

38. A capacitive micro sensor according to claim 22, wherein the shield member is provided in a recess where both electrodes oppositely face to each other.

39. A gyroscope according to claim 23, wherein the shield member for electrostatically shielding between the line portions is provided in a recess where both line portions face to each other.

40. An input device according to claim 27, wherein the shield member for electrostatically shielding between the line portions is provided in a recess where both line portions face to each other.

41. A gyroscope according to claim 28, wherein the shield member for electrostatically shielding between the line portions is provided in a recess where each of line portions faces to each other.

42. An input device according to claim 32, wherein the shield member for electrostatically shielding between the line portions is provided in a recess where each of line portions faces to each other.

43. A gyroscope comprising a vibratory strip, a driving electrode section disposed to face to the vibratory strip, that drives the vibratory strip, a driving line portion that supplies the driving electrode section with a drive signal, a detecting electrode section disposed to face to the vibratory strip that detects a displacement perpendicular to the drive direction of the vibratory strip, and a detecting line portion that transmits a detection signal from the detecting electrode section, wherein at least either the driving electrode section or the detecting electrode section is formed with a plurality of electrodes that are isolated from each other, and a shield member is provided in a direct line between said electrodes, that provides electrostatic shielding between said each electrode.

44. A gyroscope according to claim 43, wherein the vibratory strip, the line portions each connected to the electrode sections, and the shield member are all formed of on one plane.

45. A gyroscope according to claim 43, wherein the vibratory strip, the line portions each connected to the electrode sections, and the shield member are all formed of an identical conductive material.

46. A gyroscope according to claim 43, wherein the driving electrode section and the detecting electrode section are provided on base materials that are disposed to face to the vibratory strip, and the shield member is provided on the base materials.

47. A gyroscope according to claim 43, wherein the shield member is provided in a recess where both electrode sections oppositely face to each other.

48. An input device using a gyroscope, the gyroscope comprises;
 a vibratory strip, a driving electrode section disposed to face to the vibratory strip, that drives the vibratory strip, a driving line portion that supplies the driving electrode section with a drive signal, a detecting electrode section disposed to face to the vibratory strip that detects a displacement perpendicular to the drive direction of the vibratory strip, and a detecting line portion that transmits a detection signal from the detecting electrode section, wherein at least either the driving electrode section or the detecting electrode section is formed with a plurality of electrodes that are isolated from each other, and a shield member is provided in a direct line between said electrodes, that provides electrostatic shielding between said each electrode.

49. An input device according to claim 48, wherein the shield member is provided in a recess where both electrode sections oppositely face to each other.

* * * * *

UNITED STATES PATENT AND TRADEMARK OFFICE
CERTIFICATE OF CORRECTION

PATENT NO.     : 6,536,281 B2
DATED          : March 25, 2003
INVENTOR(S)    : Munemitsu Abe et al.

It is certified that error appears in the above-identified patent and that said Letters Patent is hereby corrected as shown below:

Title page,
Item [57], ABSTRACT,
Lines 6-7, delete "field-throughs" and substitute -- feed-throughs -- in its place.
Line 8, delete "fields-through" and substitute -- feed-throughs -- in its place.
Lines 13-14, delete "field-throughs" and substitute -- feed-throughs -- in its place.
Line 15, delete "field-throughs" and substitute -- feed-throughs -- in its place.

Column 1,
Line 63, delete "field-through" and substitute -- feed-throughs -- in its place.

Column 3,
Lines 16, 18, 25-26, 27, 30-31, 36, 37, 45, 49, 50, 51, 52, 53 and 54, delete all occurrences of "field-through" and substitute -- feed-throughs -- in its place.

Column 6,
Lines 10 and 11, delete both occurrences of "field-through" and substitute -- feed-throughs -- in its place.

Column 7,
Lines 4, 43, 52, 54 and 61, delete all occurences of "field-through" and substitute -- feed-throughs -- in its place.

Column 8,
Lines 26, 28-29 and 31-32, delete all occurences of "field-through" and substitute -- feed-throughs -- in its place.

UNITED STATES PATENT AND TRADEMARK OFFICE
CERTIFICATE OF CORRECTION

PATENT NO.    : 6,536,281 B2
DATED         : March 25, 2003
INVENTOR(S)   : Munemitsu Abe et al.

It is certified that error appears in the above-identified patent and that said Letters Patent is hereby corrected as shown below:

Column 10,
Lines 7 and 8, delete both occurrences of "field-through" and substitute -- feed-throughs -- in its place.

Signed and Sealed this

Twelfth Day of August, 2003

JAMES E. ROGAN
*Director of the United States Patent and Trademark Office*